Feb. 6, 1962 D. M. KALTENBACHER 3,020,404
MANUAL R.F. GAIN CONTROL
Filed July 21, 1959
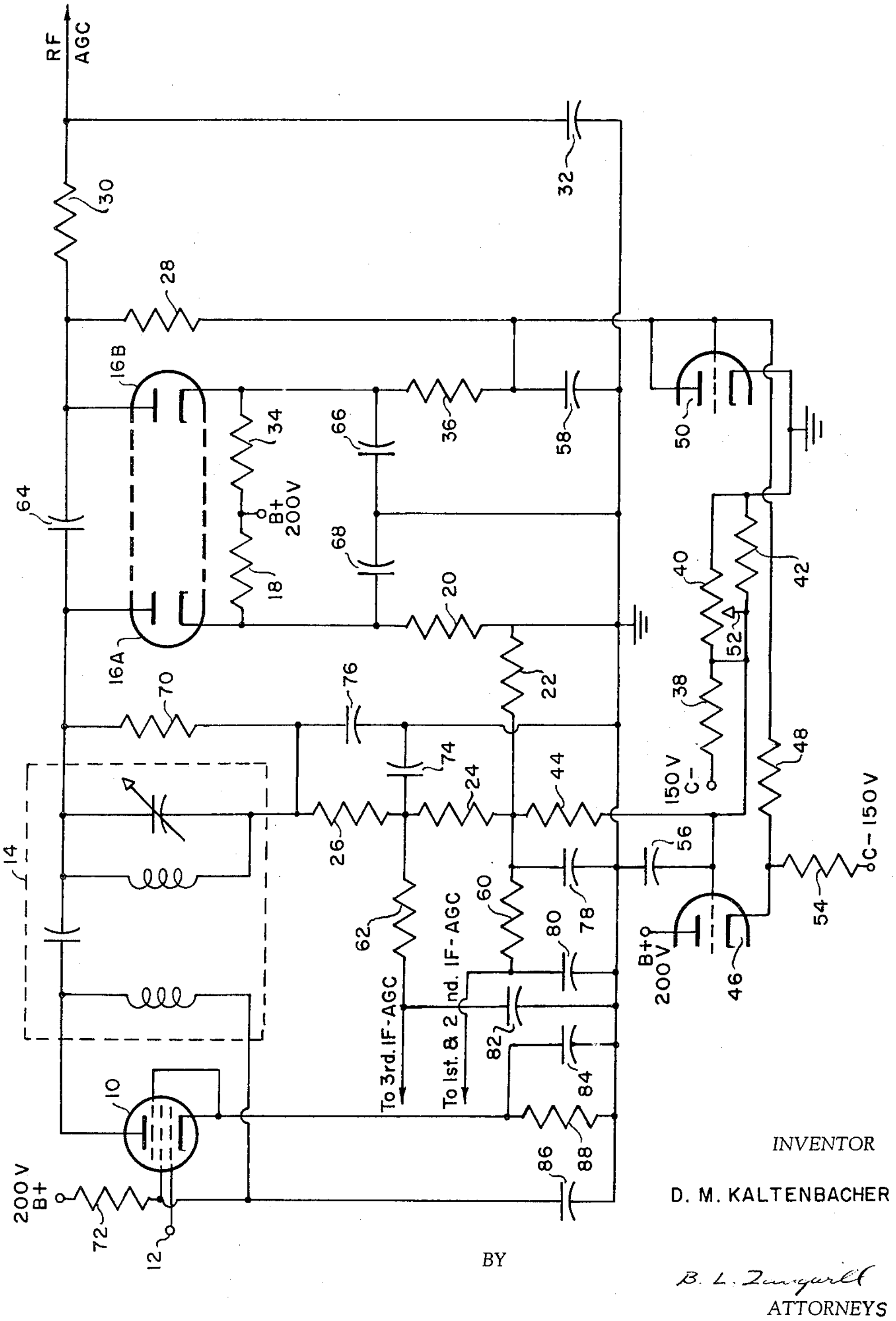
INVENTOR
D. M. KALTENBACHER
BY
B. L. Zangwill
ATTORNEYS United States Patent Office 3,020,404
Patented Feb. 6, 1962

3,020,404
MANUAL R.F. GAIN CONTROL

Dominic M. Kaltenbacher, Towson, Md., assignor, by mesne assignments, to the United States of America as represented by the Secretary of the Navy Filed July 21, 1959, Ser. No. 828,672
1 Claim. (Cl. 250—20)

This invention relates to R.F. gain control systems and particularly to a method of manually controlling the R.F. gain remotely and independently of the automatic gain control features.

In high frequency, radio direction finding systems using an Adcock antenna, the induced voltage on the antenna output is relatively small since the output is the vector difference of the voltages induced on two, single element, spaced dipoles. Furthermore, the direction of the distant station is determined by locating the vector null (or minimum) voltage direction of the antenna. In order to provide the necessary sensitivity and directional accuracy, direction finder receivers generally have a number of high gain triode R.F. amplifiers and pentode I.F. amplifiers.

Direction finder systems usually have a 180° ambiguity in direction sensing, which ambiguity may be removed by a sensing element or additional antenna which is switched into the direction finding antenna output. Low amplitude signals, noise, or modulation and distortion of the desired signal will result in errors in resolving the 180° ambiguity and in errors in direction finding.

Automatic gain control circuits have been proposed in order to stabilize these varying signals, but they have provided no means for varying the sensitivity level of the receiver for both direction finding and ambiguity resolution while providing automatic gain control.

A primary object of this invention, therefore, is to provide a combined manual gain control and automatic gain control for a direction finding receiver.

In order to insure reception of small signals on the antenna by the receiver, the A.G.C. voltage is derived from the last I.F. stage of the receiver, and applied to the I.F. stages first and then applied to the R.F. stages. In this manner the R.F. stages are operated at a relatively high level on all but very strong signals to insure good reception and to keep the signal to noise ratio of the receiver as high as possible.

Another object of this invention is to provide a single manual gain control for a direction finding receiver where the gain of the I.F. stages is reduced first and then, after a signal voltage delay, the gain of the R.F. stages is reduced. This manual gain control will therefore allow selective adjustment of the gain of the receiver, such as for 180° ambiguity resolution, while allowing the receiver to operate at the optimum signal to noise ratio.

In addition the manual adjustment of receiver gain does not interfere with the desired operation of the automatic gain control.

The exact nature of this invention as well as other objects and advantages thereof will be readily apparent from consideration of the following specification relating to the annexed drawing in which the single FIGURE is a schematic diagram of the manual R.F. gain control system.

Referring to the single FIGURE on the drawing (which illustrates a preferred embodiment), there is shown an A.G.C. amplifier tube 10 having an input 12 which is connected to the third or last I.F. stage of a direction finding receiver (not shown).

Tube 10 has an output I.F. transformer 14 which develops an I.F.-A.G.C. voltage across diode 16A. When the I.F.-A.G.C. voltage rises above the 21.5 volt level of the cathode of 16A, which is set by resistors 18 and 20, a controlling voltage is developed across resistors 22, 24, and 26 which is filtered and applied to the third I.F. stage and first and second I.F. stages.

When the A.G.C. voltage output of transformer 14 rises to 29.5 volts, diode 16B begins to conduct and an R.F.-A.G.C. voltage is developed across load resistor 28, filtered by resistor 30 and capacitor 32, and applied to the grids of the triode R.F. amplifiers (not shown). The R.F.-A.G.C. voltage delay of application is controlled by a voltage divider consisting of resistors 34 and 36.

The circuit as thus far described provides an I.F. and R.F. automatic gain control circuit having different voltage delays for the I.F. and R.F. stages and, by adjustment of resistors 22, 24, and 26 as compared with resistor 28, allows the ratio of R.F.-A.G.C. voltage to I.F.-A.G.C. voltage to be optimized for the particular receiver.

In this case the triode R.F. amplifiers required about 4 times the amount of A.G.C. voltage that the pentode I.F. amplifiers need.

In order to adjust manually the receiver gain, such as for ambiguity resolution, a voltage divider consisting of resistors 38, 40, and 42 is connected by resistor 44 to the common I.F.-A.G.C. connection between resistors 22 and 24. This voltage divider applies a negative bias of 0 to —50 volts to the I.F.-A.G.C. line and to the R.F.-A.G.C. line by cathode follower 46 and resistor 48 to the lower end of resistor 28.

Triode 50 is connected as a diode clamp from the lower end of resistor 28 to ground to prevent the R.F.-A.G.C. line from going positive.

In operation the arm 52 of resistor 40 is moved away from ground to apply a negatively increasing voltage across resistor 44 to the I.F.-A.G.C. line to reduce the I.F. amplifier gain. At the same time this negatively increasing voltage is applied to the grid of triode 46 and the cathode of tube 46 will eventually move in the negative direction to apply a negative bias to resistor 28 and the R.F.-A.G.C. line.

The delay of application of the manual R.F.-A.G.C. voltage is determined by tube 46, resistor 54 and the supply voltages and, since cathode follower tube 46 has a gain near unity, the ratio of R.F. to I.F.-A.G.C. voltage is determined by the ratio of resistors 44 and 22.

The manual gain control thus operates in addition to the I.F. and R.F.-A.G.C. voltages to provide optimum receiver stabilization and signal to noise ratio for any signal above the level preset by the manual gain control.

Filter capacitors 56 and 58 provide additional filtering for the I.F. and R.F.-A.G.C. lines for noise due to movement of arm 52 of the manual gain control.

Due to the isolating effect of large resistor 44 and cathode follower tube 46, the manual gain control may be operated at a considerable distance from the A.G.C. and receiver circuits with only a single line to the grid of tube 46 and a common ground.

In a preferred embodiment of the invention the following items were used in the schematic of the single FIGURE of the drawings:

| | | |
|---|---|---|
| Vacuum tube **10** | | 6AS6 |
| Transformer **14**—I.F. transformer tuned to 2.8 mc. part/dwg. No. N204321-2 by Bendix Aviation Corp., Baltimore, Maryland. | | |
| Tubes **16** | | 6AL5W |
| Tubes **46**, **50** | | 5670 |
| Resistors **18**, **30** | ohms | 220K |
| Resistors **20**, **48** | do | 27K |
| Resistors **22**, **36** | do | 82K |
| Resistors **24**, **44** | do | 390K |
| Resistors **26** | do | 18K |
| Resistors **28**, **34** | do | 470K |
| Resistors **38** | do | 81K |
| Resistors **40** | do | 100K |

| | | |
|---|---|---|
| Resistors 42 | do | 68K |
| Resistors 54 | do | 270K |
| Resistors 60 | do | 560K |
| Resistors 62 | do | 2.2M |
| Resistors 70 | do | 39K |
| Resistors 72 | do | 3.9K |
| Resistors 88 | do | 270 |
| Capacitor 56, 76 | micromicrofarads | 470 |
| Capacitor 32, 58, 78, 80, 82, 84, 86 | microfarads | .25 |
| Capacitor 64, 66, 68 | micromicrofarads | 220 |
| Capacitor 74 | microfarads | .5 |

The supply voltages are as listed on the single figure of the drawings.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention.

What is claimed is:

A manual radio frequency gain control for a direction finding radio receiver having radio and intermediate frequency amplifiers comprising a first automatic gain control circuit having an input adapted to be connected to the output of said intermediate frequency amplifiers for varying the gain of said intermediate frequency amplifiers, said first circuit including a rectifier biased at a first level to provide a controlling voltage for said intermediate frequency amplifiers, a second automatic gain control circuit having an input adapted to be connected to the output of said intermediate frequency amplifiers and having an output for varying the gain of said radio frequency amplifiers, said second circuit having a rectifier biased at a second level to provide a controlling voltage for said radio frequency amplifiers, said second circuit output including a diode clamp to prevent the output from going positive, a manual gain control comprising a variable voltage source connected to said first circuit for manually varying the gain of said intermediate frequency amplifiers, and a cathode follower means connected between said variable voltage source and second circuit output for raising the level of said variable source above the level applied to said intermediate frequency amplifiers and applying said variable voltage to said second circuit for clamping by said diode clamp whereby manual gain control may be applied first to said intermediate frequency amplifiers and then to said radio frequency amplifiers to maintain the optimum signal to noise ratio throughout said receiver.

References Cited in the file of this patent

UNITED STATES PATENTS

| | | |
|---|---|---|
| 2,022,478 | Peterson | Nov. 26, 1935 |
| 2,085,928 | Stevens | July 6, 1937 |
| 2,171,645 | Broos | Sept. 5, 1939 |
| 2,199,350 | Shofstall | Apr. 30, 1940 |
| 2,200,062 | Groeneveld | May 7, 1940 |